United States Patent
Cheng

(10) Patent No.: US 11,876,117 B2
(45) Date of Patent: Jan. 16, 2024

(54) FIELD EFFECT TRANSISTOR WITH REDUCED PARASITIC CAPACITANCE AND RESISTANCE

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 256 days.

(21) Appl. No.: 17/451,171

(22) Filed: Oct. 18, 2021

(65) Prior Publication Data
US 2023/0118330 A1    Apr. 20, 2023

(51) Int. Cl.
| | |
|---|---|
| *H01L 29/423* | (2006.01) |
| *H01L 29/06* | (2006.01) |
| *H01L 29/417* | (2006.01) |
| *H01L 29/66* | (2006.01) |

(52) U.S. Cl.
CPC .... *H01L 29/42356* (2013.01); *H01L 29/0649* (2013.01); *H01L 29/41766* (2013.01); *H01L 29/6653* (2013.01); *H01L 29/6656* (2013.01); *H01L 29/66553* (2013.01)

(58) Field of Classification Search
CPC ........... H01L 29/42356; H01L 29/0649; H01L 29/41766; H01L 29/6653; H01L 29/66553; H01L 29/6656; H01L 29/41775; H01L 29/161; H01L 29/165; H01L 29/66545; H01L 29/7848; H01L 29/4991; H01L 29/785; H01L 29/66795
See application file for complete search history.

(56) References Cited

U.S. PATENT DOCUMENTS

| | | | |
|---|---|---|---|
| 6,238,987 B1 | 5/2001 | Lee | |
| 7,812,411 B2 | 10/2010 | Cheng | |
| 9,508,810 B1 | 11/2016 | Cheng | |
| 9,892,961 B1* | 2/2018 | Cheng | ............... H01L 23/53295 |
| 10,079,293 B2 | 9/2018 | Xu | |
| 10,236,255 B2 | 3/2019 | Li | |
| 10,312,148 B2 | 6/2019 | Cheng | |
| 10,535,747 B2 | 1/2020 | Liu | |
| 10,580,692 B1 | 3/2020 | Park | |

(Continued)

FOREIGN PATENT DOCUMENTS

KR    100518525 B1    10/2005

OTHER PUBLICATIONS

International Searching Authority, "Notification of International Search Report and Written Opinion or Declaration", International Application No. PCT/EP2022/077223, dated Feb. 15, 2023, 13 pages.

(Continued)

*Primary Examiner* — Dao H Nguyen
(74) *Attorney, Agent, or Firm* — Michael A. Petrocelli

(57) ABSTRACT

A field effect transistor includes a gate structure formed adjacent to a source/drain region, and a spacer structure formed between the gate structure and the source/drain region. The spacer structure includes a top spacer and a bottom spacer, the top spacer includes an airgap having a bottom portion that is wider than a top portion. The wider bottom portion of the airgap is located between the gate structure and the source/drain region.

17 Claims, 14 Drawing Sheets

(56) References Cited

U.S. PATENT DOCUMENTS

| | | | |
|---|---|---|---|
| 10,700,180 B2* | 6/2020 | Chen | H01L 29/6653 |
| 10,903,337 B2 | 1/2021 | Zhang | |
| 10,923,574 B2 | 2/2021 | Liu | |
| 2014/0024192 A1* | 1/2014 | Kim | H01L 29/165 |
| | | | 438/296 |
| 2014/0138779 A1* | 5/2014 | Xie | H01L 29/66553 |
| | | | 257/401 |
| 2015/0091089 A1 | 4/2015 | Niebojewski | |
| 2018/0076199 A1 | 3/2018 | Wang | |
| 2020/0020567 A1 | 1/2020 | Sun | |
| 2020/0091309 A1 | 3/2020 | Lin | |
| 2020/0127110 A1 | 4/2020 | Lee | |
| 2020/0219989 A1* | 7/2020 | Cheng | H01L 29/6656 |
| 2021/0098591 A1 | 4/2021 | Frougier | |
| 2021/0118749 A1 | 4/2021 | Lai | |
| 2022/0367668 A1* | 11/2022 | Lin | H01L 27/0886 |

OTHER PUBLICATIONS

Benoit, et al., "Interest of SiCO Low k=4.5 Spacer Deposited at Low Temperature (400° C.) in the perspective of 3D VLSI Integration", 2015 IEEE International Electron Devices Meeting (IEDM), 2015, pp. 8.6.1-8.6.4, <https://ieeexplore.ieee.org/document/7409656>.

Varadarajan, Bhadri, "SPARC: a novel technology for depositing conformal dielectric thin films with compositional tuning for etch selectivity", Proc. SPIE 10963, Advanced Etch Technology for Nanopatterning VIII, 1096307, Mar. 20, 2019, Abstract only, 1 page, <https://spie.org/Publications/Proceedings/Paper/10.1117/12.2517407>.

* cited by examiner

US 11,876,117 B2

FIELD EFFECT TRANSISTOR WITH REDUCED PARASITIC CAPACITANCE AND RESISTANCE

BACKGROUND

The present invention generally relates to the field of semiconductor devices, and more particularly to forming a field effect transistor device with reduced parasitic capacitance and resistance.

Complementary metal-oxide-semiconductor (CMOS) technology is commonly used for fabricating field effect transistors (FETs) as part of advanced integrated circuits (IC), such as CPUs, memory, storage devices, and the like. As integrated circuits continue to scale downward in size, there is a growing need in CMOS technology to achieve higher device density without affecting performance and/or reliability while keeping production costs down. However, as device dimensions and component spacing continues to shrink to meet increasing demands for smaller electronic devices, parasitic capacitance and parasitic resistance increase, causing undesirable effects such as RC delay, power dissipation, and capacitively couples signals, also known as cross-talk.

SUMMARY

According to an embodiment of the present disclosure, a semiconductor structure includes a gate structure located adjacent to a source/drain region, and a spacer structure located between the gate structure and the source/drain region, the spacer structure includes a bottom spacer and a top spacer having an airgap, the airgap in the top spacer has a bottom portion that is wider than a top portion, the wider bottom portion of the airgap is located between the gate structure and the source/drain region.

According to another embodiment of the present disclosure, a semiconductor structure includes a metal gate stack in contact with a first portion of a channel layer on a substrate, the first portion of the channel layer located between source/drain regions, a first spacer located above a second portion of the channel layer extending outwards from the metal gate stack, the first spacer disposed between a bottom portion of the metal gate stack and portions of the source/drain regions located above the substrate, and a contact structure above the source/drain regions, the contact structure is in contact with a second spacer disposed above the first spacer and between the contact structure and the metal gate stack, the second spacer includes an airgap having a bottom portion that is wider than a top portion, the wider bottom portion of the airgap is located between the metal gate stack and each of the source/drain regions.

According to another embodiment of the present disclosure, a method of forming a semiconductor structure includes forming a metal gate stack in contact with a first portion of a channel layer on a substrate, the first portion of the channel layer is located between source/drain regions, forming a first spacer above a second portion of the channel layer extending outwards from the metal gate stack, the first spacer is formed between a bottom portion of the metal gate stack and portions of the source/drain regions located above the substrate, forming a contact structure above the source/drain regions, and forming a second spacer above the first spacer and between the contact structure and the metal gate stack, the second spacer including an airgap having a bottom portion that is wider than a top portion, the wider bottom portion of the airgap is located between the metal gate stack and each of the source/drain regions.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
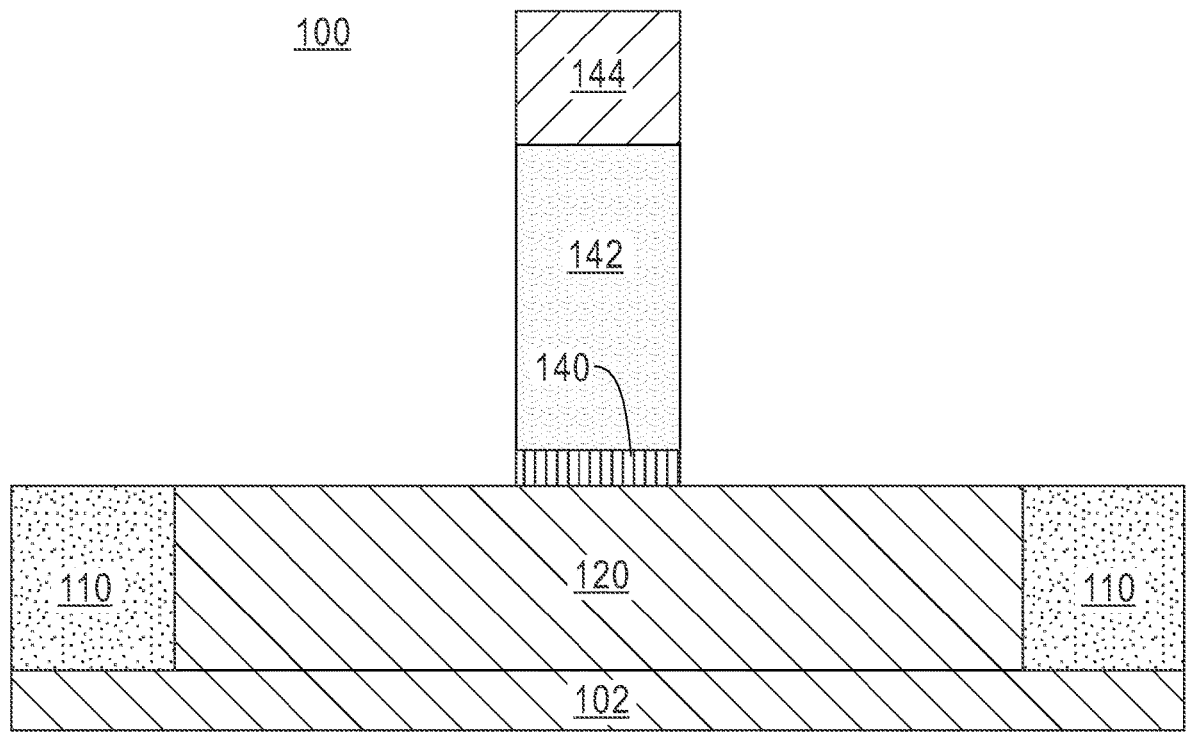
FIG. 1 is a cross-sectional view of a semiconductor structure at an intermediate step during a semiconductor manufacturing process, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As device dimensions and component spacing continues to shrink to meet increasing demands for smaller electronic devices, parasitic capacitance and resistance increase, thereby augmenting power consumption and degrading device performance.

Formation of airgap spacers is being pursued as an alternative for reducing parasitic capacitance in current CMOS technology. In a conventional approach airgap spacers are formed by first depositing a sacrificial spacer on gate sidewalls, forming source/drain regions and contacts, and then removing the sacrificial spacer after source/drain regions and contacts have been formed to create an airgap between the gate and source/drain contacts. Furthermore, wrap-around contact (WAC) formation on source/drain regions is considered a viable option to reduce contact resistance by increasing the contact area between metal contacts and the source/drain regions. However, traditional approaches for forming airgap spacers and wrap-around contacts have the following drawbacks: 1) recessing the sacrificial spacer all the way down to the channel region compromises the high-k/metal gate stack which results in a threshold voltage shift, and 2) although WAC reduces contact resistance, the narrow width of the metal contacts results in high contact via resistance.

Therefore, embodiments of the present disclosure provide a field effect transistor device, and a method of making the same, in which airgap spacers and wrap-around contacts can be simultaneously formed for reducing parasitic capacitance and parasitic resistance at the same time. The proposed field effect transistor includes a self-aligned sacrificial cap layer formed above source/drain regions during source/drain epitaxy. The sacrificial cap allows removing a majority of a low-k spacer material from the gate sidewalls while preserving the low-k spacer material disposed adjacent to the channel region of the device. A new sacrificial spacer, substantially thinner than the original low-k spacer, is formed on the gate sidewalls while the sacrificial cap is removed during contact patterning to enable wrap-around contact (WAC) formation. After forming the WAC, the sacrificial spacer is removed selective to the original low-k spacer to form airgap spacers. In the proposed embodiments, the high-k/metal gate around the channel region is fully protected by the low-k spacer. After forming the WAC and removing the sacrificial spacer, inner portions of the contact liner located on the WAC sidewalls can be removed to increase a size of the airgap spacers to meet reliability requirements while reducing contact via resistance.

Embodiments by which the airgaps spacers and WAC can be formed for simultaneously reducing parasitic capacitance and resistance are described in detailed below by referring to the accompanying drawings in FIGS. 1-14.

Figure 1A:
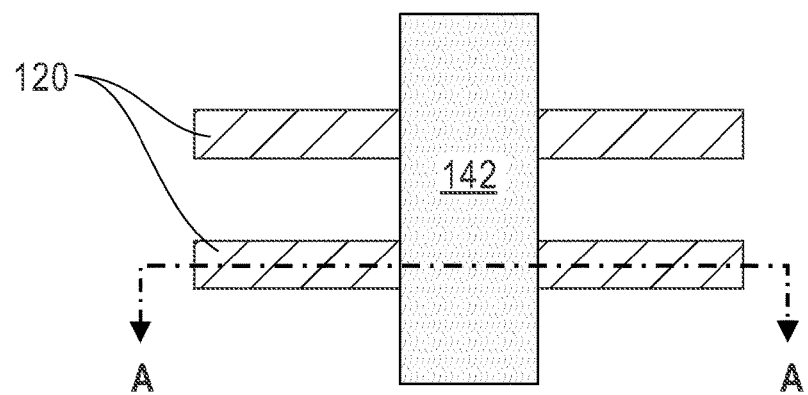
FIG. 1A is a top-down view of the semiconductor structure.

Referring now to FIGS. 1-1A, a cross-sectional view of a semiconductor structure 100 taken along line A-A of FIG. 1A is shown at an intermediate step during a semiconductor manufacturing process, according to an embodiment of the present disclosure. In this embodiment, FIG. 1A is a top-down view of the semiconductor structure 100. Specifically, FIG. 1 depicts a cross-sectional view of the semiconductor structure 100 taken along a fin 120 formed from patterning a substrate 102 using methods well-known in the art.

It is understood that although the disclosed embodiments include a detailed description of an exemplary FinFET architecture, implementation of the teachings recited herein are not limited to the particular FET architecture described herein. Rather, embodiments of the present invention are capable of being implemented in conjunction with any other type of FET device now known or later developed including, but not limited to, planar FETs, FinFETs, nanowire transistors, nanosheet transistors, nanoribbon transistors, etc.

Conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

At this point of the fabrication process, the semiconductor structure 100 includes one or more channel layers represented by, for example, fins 120 in the context of FinFET architecture. The fins 120 are formed from the substrate 102. The substrate 102 may be made of any semiconductor material including, but not limited to, silicon, germanium, silicon-germanium alloy, carbon-doped silicon, carbon-doped silicon-germanium alloy, and compound semiconductor materials. The semiconductor structure 100 may further include shallow trench isolation (STI) regions 110 formed within the substrate 102 for electrically isolating active regions within the substrate 102. The process of forming STI regions 110 is standard and typically includes etching the substrate 102 to create recesses that are filled with an insulator material using any deposition method known in the art. The insulator material used to form the STI regions 110 may consist of any low-k dielectric material including, but not limited to: silicon nitride, silicon oxide, silicon oxynitride and fluoride-doped silicate glass.

As known by those skilled in the art, the fins 120 may be formed by any method known in the art. In an exemplary embodiment, the fins 120 may be formed by a sidewall image transfer (SIT) technique. It should be noted that, while the embodiment depicted in FIG. 1A includes two fins 120, any number of fins may be formed from the substrate 102. In an exemplary embodiment, the fins 120 may have a height ranging from approximately 5 nm to approximately 100 nm, a width ranging from approximately 5 nm to approximately 20 nm and may be separated by a space ranging from approximately 20 nm to 100 nm.

With continued reference to FIGS. 1-1A, the semiconductor structure 100 may further include a sacrificial or dummy gate stack consisting of a sacrificial gate oxide 140 disposed above a portion of the fins 120 corresponding to a channel region of the semiconductor structure 100, a dummy gate 142 disposed above the sacrificial gate oxide 140 and a sacrificial gate hardmask 144 disposed above the dummy gate 142. It should be noted that the described FinFET device may be fabricated using either a replacement metal gate (RMG) or gate last process flow, or a gate first process flow. For illustration purposes only, without intent of limitation, the embodiment described below uses a gate last process flow.

In this embodiment, the channel region of the semiconductor structure 100 corresponds to the portion or section of the fins 120 covered by (i.e., below) the sacrificial gate stack (i.e., the sacrificial gate oxide 140, the dummy gate 142, and the sacrificial gate hardmask 144). The portion of the fins 120 not covered by the sacrificial gate structure defines the source/drain regions of the semiconductor structure 100. As mentioned above, embodiments of the present disclosure can be applied to other device configurations including planar and gate-all-around (GAA) transistors.

In an exemplary embodiment, the sacrificial gate oxide 140 is made of an oxide material including, but not limited to, $SiO_2$, $HfO_2$, $ZrO_2$, $Al_2O_3$, $TiO_2$, $La_2O_3$, $SrTiO_3$, $LaAlO_3$, and mixtures thereof. The dummy gate 142 is formed from amorphous silicon (a-Si), and the sacrificial gate hardmask 144 is formed from silicon nitride (SiN), silicon oxide, an oxide/nitride stack, or similar materials and configurations. The sacrificial gate hardmask 144 is typically formed over the dummy gate 142 to act as an etch stop. It should be noted that the process of forming the sacrificial gate oxide, the dummy gate 142 and the sacrificial gate hardmask 144 is typical and well-known in the art.

Figure 2:
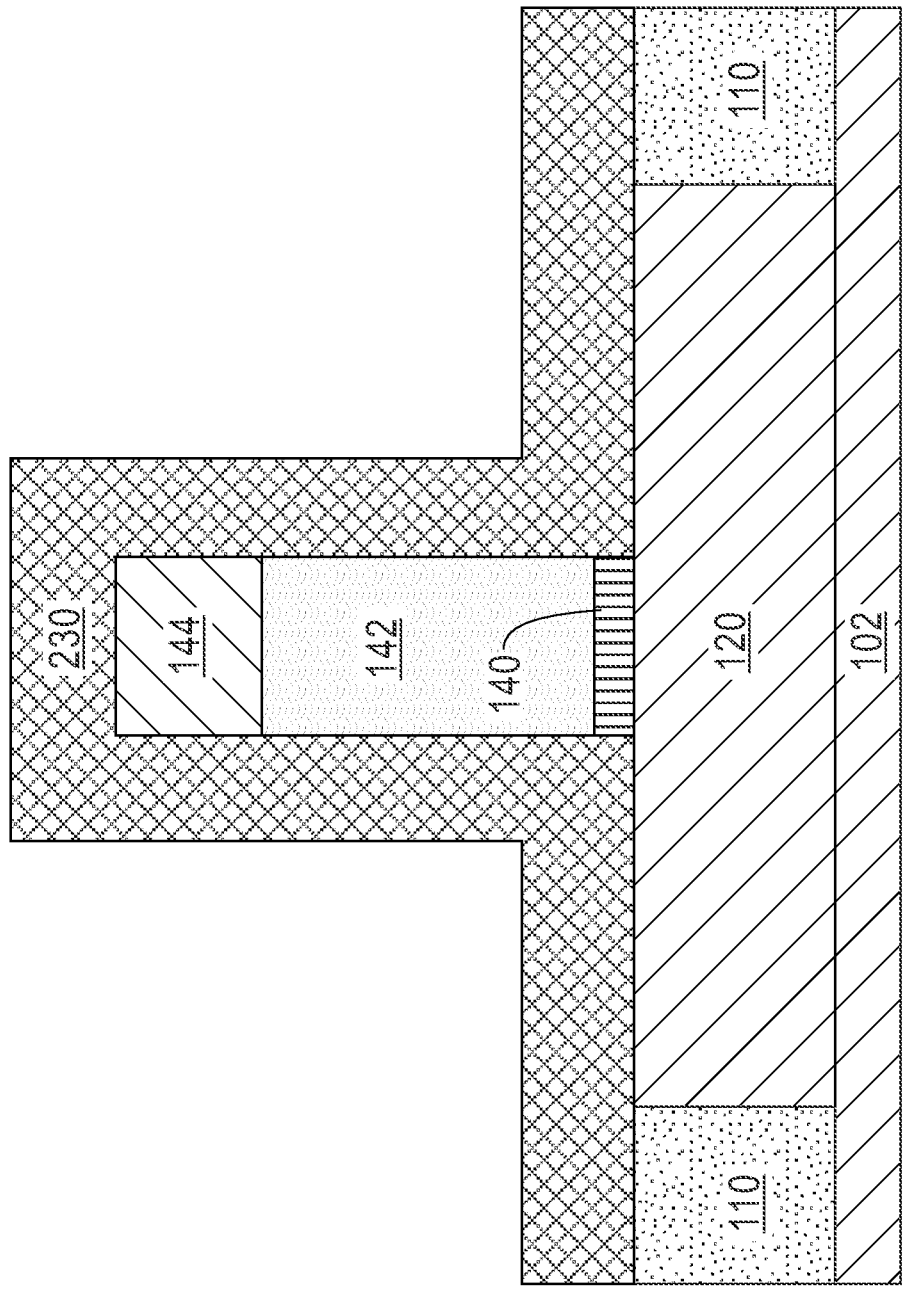
FIG. 2 is a cross-sectional view of the semiconductor structure after depositing a layer of a spacer material, according to an embodiment of the present disclosure.

Referring now to FIG. 2, a cross-sectional view of the semiconductor structure 100 is shown after depositing a layer of a spacer material 230, according to an embodiment of the present disclosure. Preferably, the spacer material 230 consists of a low-k dielectric material. Non-limiting examples of various (low-k) materials for forming the spacer material 230 may include silicon oxynitride (SiON), carbon-doped silicon oxide (SiOC), fluorine-doped silicon oxide (SiO:F), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. The dielectric material can be a low-k material having a dielectric constant less than about 7, and more preferably less than about 5. The spacer material 230 can be deposited, for example, by atomic layer deposition (ALD), chemical vapor deposition (CVD), or any other suitable deposition processes. Preferably, the spacer material is deposited by a conformal deposition process. A thickness of the spacer material 230 may vary from approximately 6 nm to approximately 8 nm, and ranges therebetween.

Figure 3:
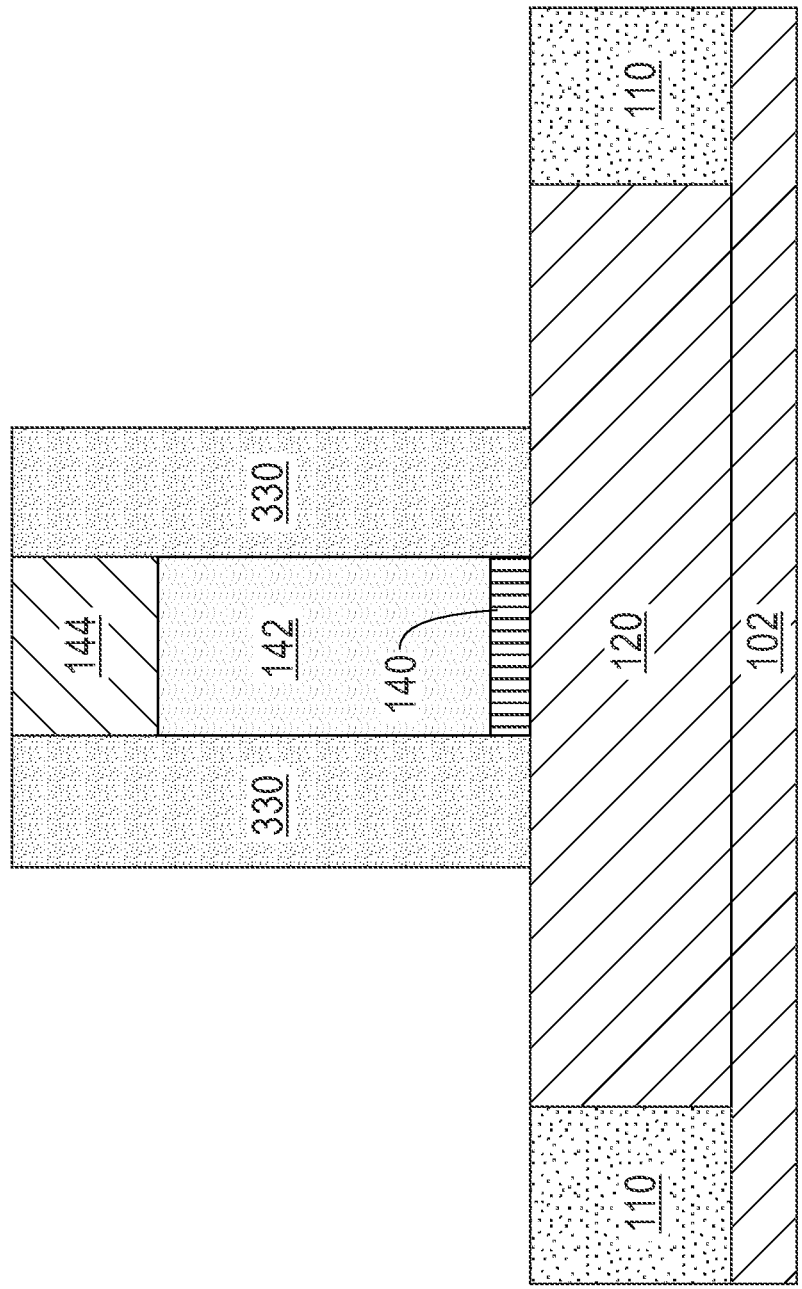
FIG. 3 is a cross-sectional view of the semiconductor structure after etching the spacer material and forming first spacers, according to an embodiment of the present disclosure.

Referring now to FIG. 3, a cross-sectional view of the semiconductor structure 100 is shown after etching the spacer material 230 (FIG. 2) to form first spacers 330, according to an embodiment of the present disclosure. The process of forming the first spacers 330 includes the deposition of the spacer material 230 (FIG. 2) followed by directional reactive-ion-etching (RIE) of the deposited spacer material 230 (FIG. 2). As depicted in the figure, the first spacers 330 have been formed along sidewalls of the sacrificial gate oxide 140, dummy gate 142 and sacrificial gate hardmask 144. While the first spacers 330 are herein described in the plural, the first spacers 330 may consist of a single spacer surrounding the sacrificial gate structure formed by the sacrificial gate oxide 140, the dummy gate 142 and the sacrificial gate hardmask 144. In this embodiment, the first spacers 330 extends outwards from the sacrificial gate structure. Stated differently, the first spacer 330 are formed on portions of the fin 120 not covered by the sacrificial gate structure.

In an embodiment, a thickness (or horizontal width) of the first spacers 330 may be approximately 6 nm, although thicknesses below or above this value may also be considered.

Figure 4:
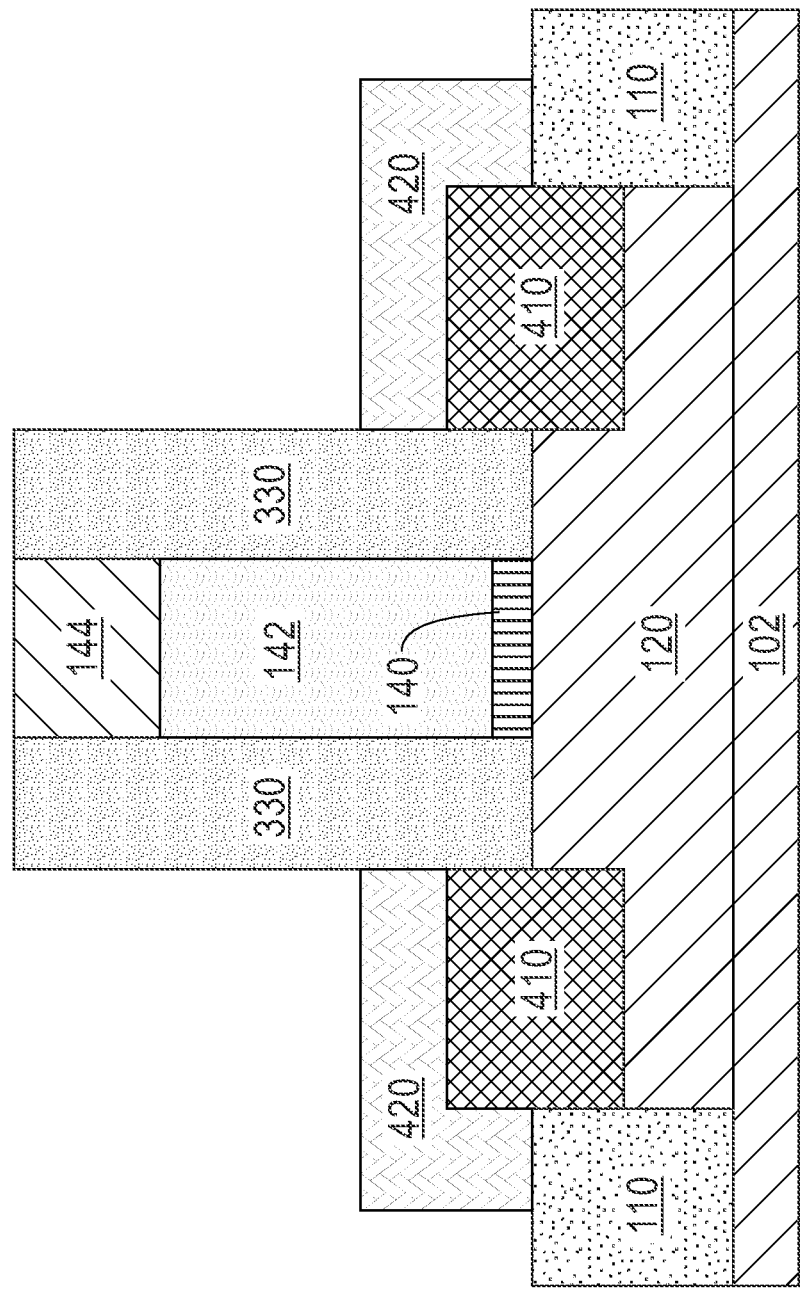
FIG. 4 is a cross-sectional view of the semiconductor structure after forming source/drain regions and a sacrificial cap, according to an embodiment of the present disclosure.

Referring now to FIG. 4, a cross-sectional view of the semiconductor structure 100 is shown after forming source/drain regions 410 and a sacrificial cap 420, according to an embodiment of the present disclosure. As depicted in the figure, the sacrificial cap 420 is formed directly above the source/drain regions 410 and adjacent to the first spacers 330 and STI regions 110.

The process of forming the source/drain regions 410 typically include etching upper portions of the fins 120 not covered by the sacrificial gate structure (i.e., sacrificial gate oxide 140, dummy gate 142 and sacrificial gate hardmask 144) and the first spacers 330 to form source/drain recesses (not shown). In an exemplary embodiment, a RIE process can be used to recess such portions of the fins 120. An epitaxial layer growth process is then performed on the exposed surfaces of the recessed fins 120. Specifically, an in-situ doped material (e.g., phosphorus-doped silicon (Si:P) for n-type FETs or boron-doped silicon germanium (SiGe:B) for p-type FETs) is epitaxially grown within the source/drain recesses (not shown) to form the source/drain regions 410.

In general, the source/drain regions 410 can be formed by epitaxial growth by using the substrate 102 and exposed sidewalls of fin 120 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the source/drain regions 410. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

After forming the source/drain regions 410, the sacrificial cap 420 can be formed by epitaxially growing a layer of silicon-germanium (SiGe) off the source/drain regions 410. In this embodiment, the layer of SiGe forming the sacrificial cap 420 may have a germanium (Ge) concentration that is approximately 20 atomic percent to approximately 40 atomic percent greater than a germanium atomic percent of the source/drain regions 410 such that the sacrificial cap 420 can be removed selectively to the source/drain regions 410. In another embodiment, the sacrificial cap 420 can be formed by epitaxially growing a layer of germanium.

Accordingly, by using an epitaxy growth process to form the sacrificial cap 420, epitaxial growth occurs only on the semiconductor material forming the source/drain regions 410, it does not occur on the dielectric material forming the first spacers 330 and/or the STI regions 110. The sacrificial cap 420 may allow removing a majority of spacer material from gate sidewalls while preserving the spacer material adjacent to the channel region (i.e., first spacer 330). Additionally, the sacrificial cap 420 may allow the formation of wrap-around contacts in the semiconductor structure 100, as will be described in detail below. In an exemplary embodiment, a thickness of the sacrificial cap 420 may vary from approximately 5 nm to approximately 20 nm, and ranges therebetween.

Figure 5:
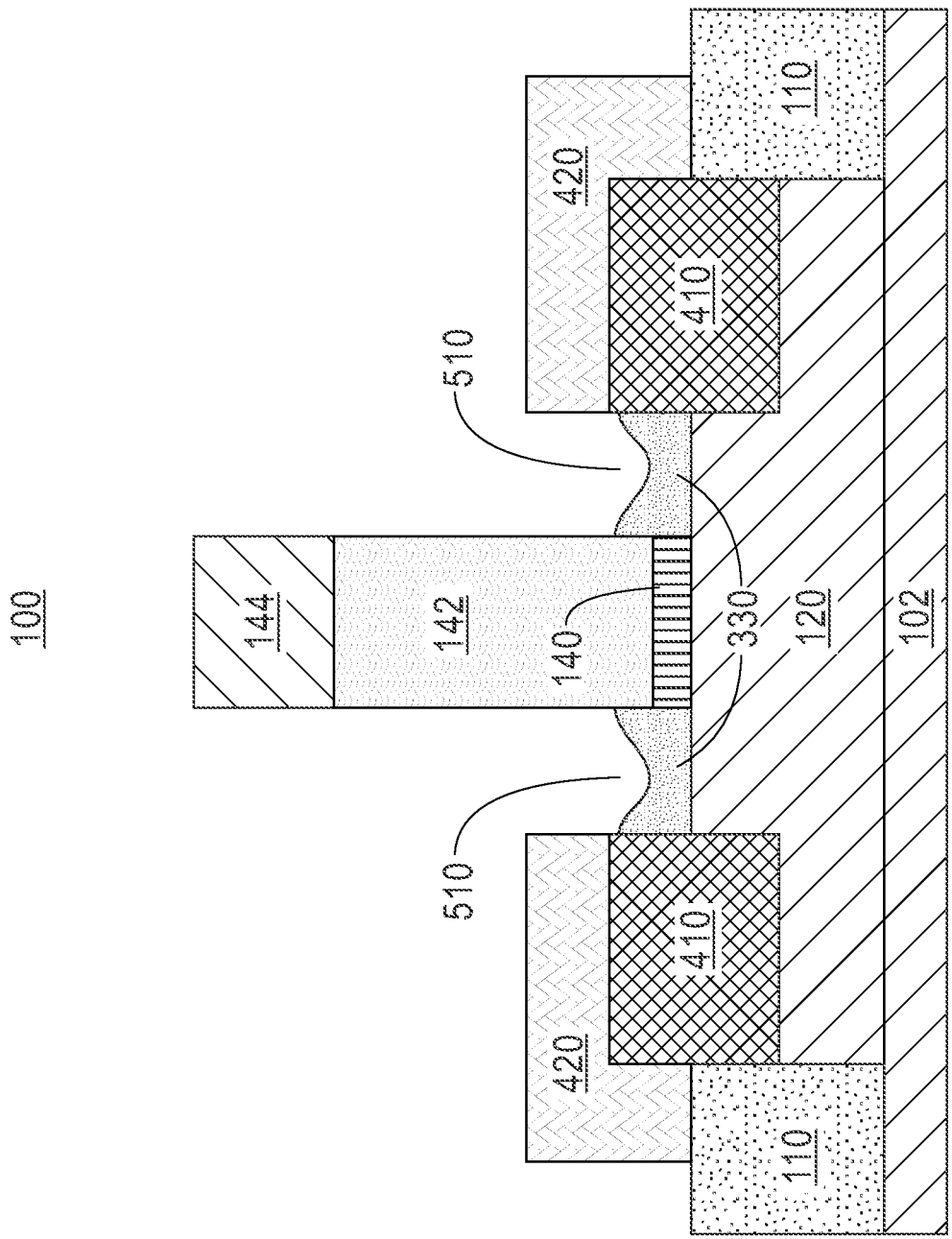
FIG. 5 is a cross-sectional view of the semiconductor structure after partially removing the first spacers, according to an embodiment of the present disclosure.

Referring now to FIG. 5, a cross-sectional view of the semiconductor structure 100 is shown after partially removing the first spacers 330, according to an embodiment of the present disclosure. An isotropic etch process is conducted to recess the first spacers 330, as depicted in the figure. In an exemplary embodiment in which the first spacers 330 include SiOC, a hydrogen plasma treatment followed by an aqueous etch process containing hydrogen fluoride (HF) can be performed to remove upper portions of the first spacers 330. As depicted in the figure, a portion of the first spacers 330 remains between bottom opposite sidewalls of the sacrificial gate structure and the source/drain regions 410. Particularly, in this embodiment, the first spacers 330 remain along opposite sidewalls of the sacrificial gate oxide 140 and a bottom portion of the dummy gate 142. After etching the first spacers 330, a gap 510 is formed between the sacrificial cap 420 located above the source/drain regions 410 and the dummy gate 142. In some embodiments, the gap 510 may expose portions of the source/drain regions 410.

Figure 6:
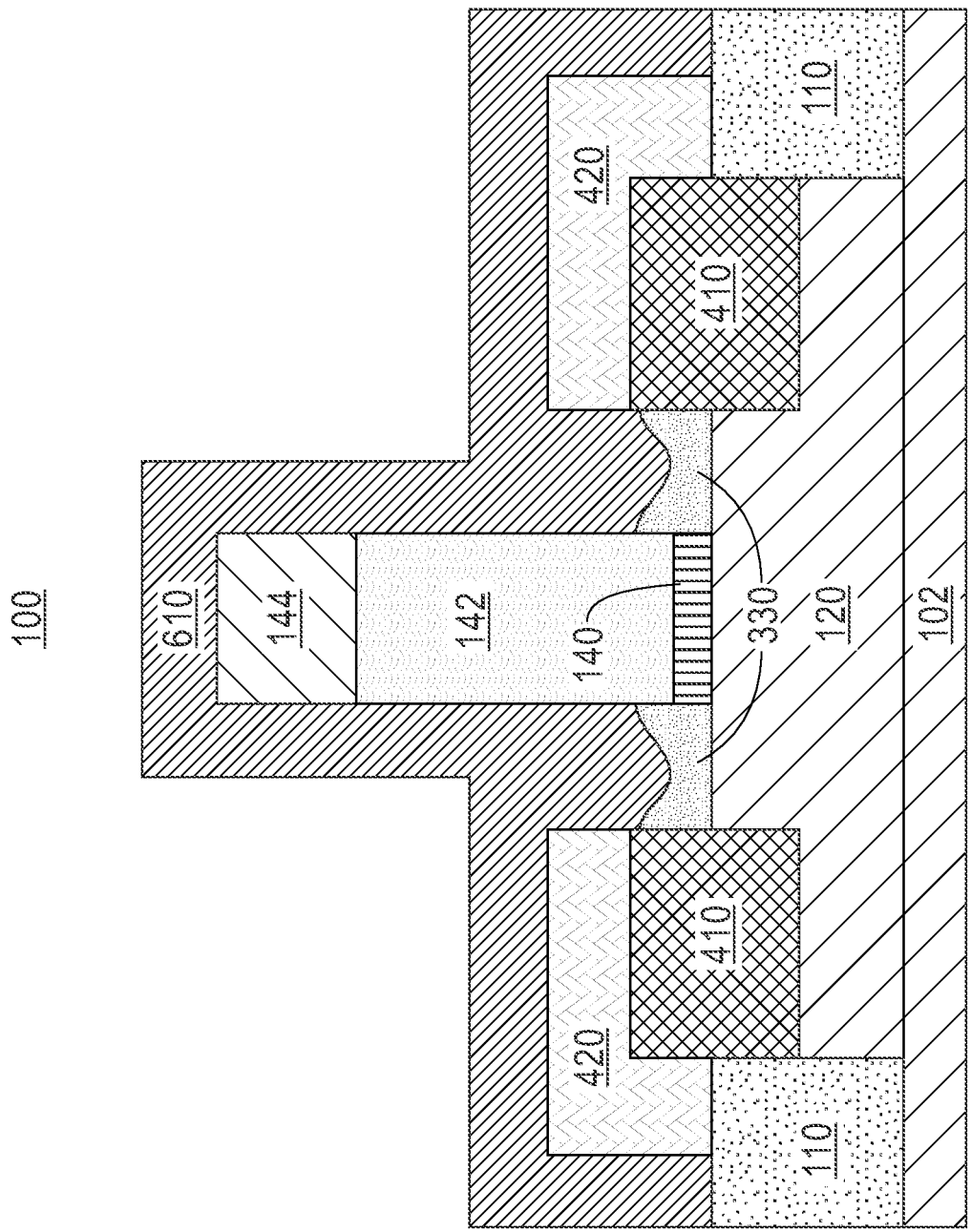
FIG. 6 is a cross-sectional view of the semiconductor structure after forming a sacrificial spacer, according to an embodiment of the present disclosure.

Referring now to FIG. 6, a cross-sectional view of the semiconductor structure 100 is shown after forming a sacrificial spacer 610, according to an embodiment of the present disclosure. In this embodiment, the sacrificial spacer 610 is made of a dielectric material including, for example, silicon nitride (SiN). The sacrificial spacer 610 deposits above exposed upper surfaces and sidewalls of all elements in the semiconductor structure 100, as depicted in the figure. Particularly, the sacrificial spacer 610 deposits above the first spacers 330 pinching-off each of the gaps 510 (FIG. 5) located above an uppermost surface of the first spacers 330, between the sacrificial cap 420 and the dummy gate 142.

According to an embodiment, a conformal deposition technique (e.g., ALD, CVD, etc.) can be used to form the sacrificial spacer 610. Preferably, a thickness of the sacrificial spacer 610 is less than a thickness of the (low-k) spacer material 230 forming the first spacers 330. For example, when the thickness of the spacer material 230 forming the first spacers 330 is approximately 6 nm, the thickness of the sacrificial spacer 610 is approximately 4 nm.

Figure 7:
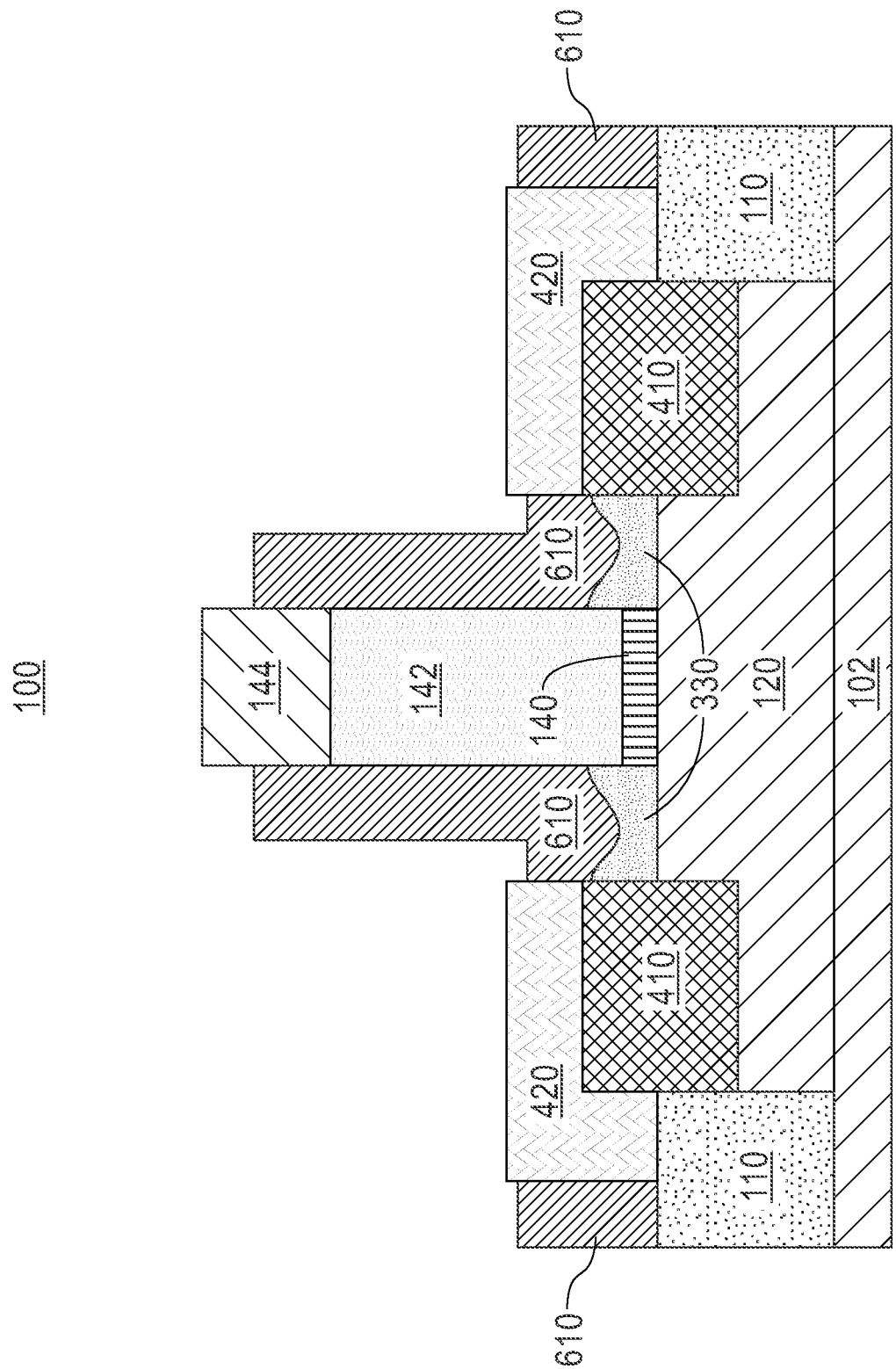
FIG. 7 is a cross-sectional view of the semiconductor structure after etching the sacrificial spacer, according to an embodiment of the present disclosure.

Referring now to FIG. 7, a cross-sectional view of the semiconductor structure 100 is shown after etching the sacrificial spacer 610, according to an embodiment of the present disclosure. In an exemplary embodiment, etching the sacrificial spacer 610 is conducted using a RIE process. Etching of the sacrificial spacer 610 exposes top portions of the sacrificial cap 420 and sacrificial gate hardmask 144, as illustrated in the figure.

Figure 8:
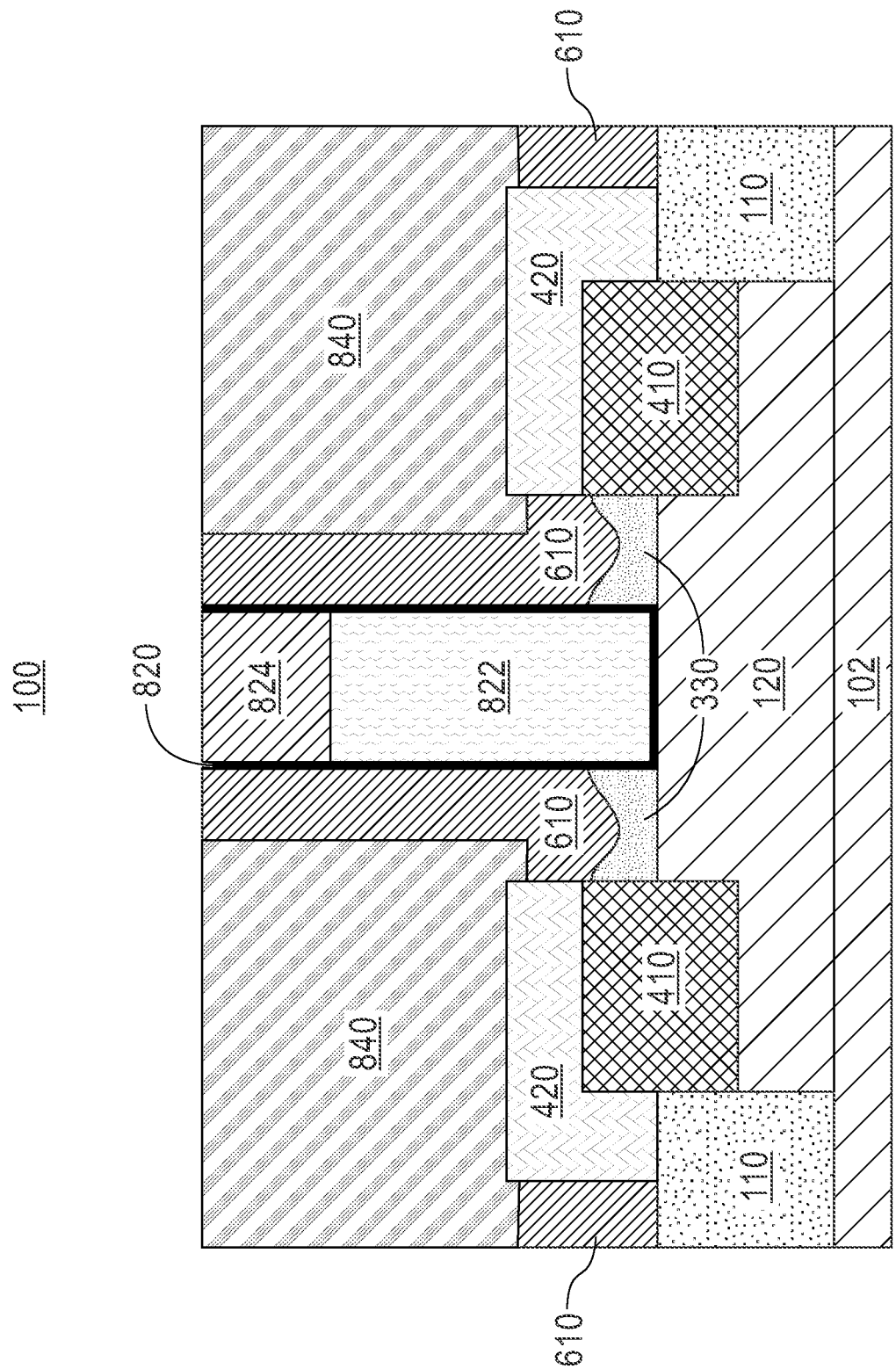
FIG. 8 is a cross-sectional view of the semiconductor structure after completing a replacement metal gate process, according to an embodiment of the present disclosure.

Referring now to FIG. 8, a cross-sectional view of the semiconductor structure 100 is shown after completing a replacement metal gate process, according to an embodiment of the present disclosure.

In this embodiment, a first dielectric layer 840 is formed to fill voids between gate structures and other existing devices within the semiconductor structure 100. The first dielectric layer 840 can be formed by, for example, CVD of a first dielectric material. Non-limiting examples of dielectric materials to form the first dielectric layer 840 may include silicon oxide, silicon nitride, hydrogenated silicon carbon oxide, silicon based low-k dielectrics, flowable oxides, porous dielectrics, or organic dielectrics including porous organic dielectrics. After deposition of the first dielectric layer 840, a CMP process is conducted on the semiconductor structure 100 to expose a top surface of the sacrificial gate stack (i.e., sacrificial gate oxide 140, dummy gate 142 and sacrificial gate hardmask 144 depicted in FIG. 7).

At this step of the manufacturing process, the sacrificial gate stack formed by the sacrificial gate oxide 140, the dummy gate 142 and the sacrificial gate hardmask 144 shown in FIG. 7 is removed using known etching processes including, for example, RIE or chemical oxide removal (COR). In a gate-last fabrication process, the removed dummy gate 142 is thereafter replaced with a metal gate as known in the art. It should be noted that the sacrificial gate stack is removed selectively to the first spacers 330 and sacrificial spacers 610.

After removing the sacrificial gate stack, a metal gate stack typically consisting of a gate dielectric 820, a gate electrode 822 and a gate cap 824 is formed in the semiconductor structure 100. The gate dielectric 820 may include a high-k dielectric material. Non-limiting examples of high-k dielectric materials for forming the gate dielectric 820 may include metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric 820 may be formed using standard deposition techniques such as, for example, CVD, plasma-assisted CVD, ALD, evaporation, reactive sputtering, chemical solution deposition or other like deposition processes. A thickness of the gate dielectric 820 may vary from approximately 1.5 nm to approximately 5 nm, and ranges therebetween. In some embodiments, an interfacial layer (not shown) can be formed between the high-k gate dielectric 820 and the channel layer.

The gate electrode 822 may consist of any suitable conducting material, including, but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaMgC, carbon nanotube, conductive carbon, graphene, or any suitable combination of these materials. The conductive material may further include dopants that are incorporated during or after deposition. In some embodiments, the gate electrode 822 may further include a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate electrode 822 and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

The gate cap 824 may be formed above the gate electrode 822 using standard deposition techniques. The gate cap 824 may include, but is not limited to, silicon oxide, silicon nitride, silicon oxynitride, boron nitride, or any suitable combination of those materials.

Figure 9:
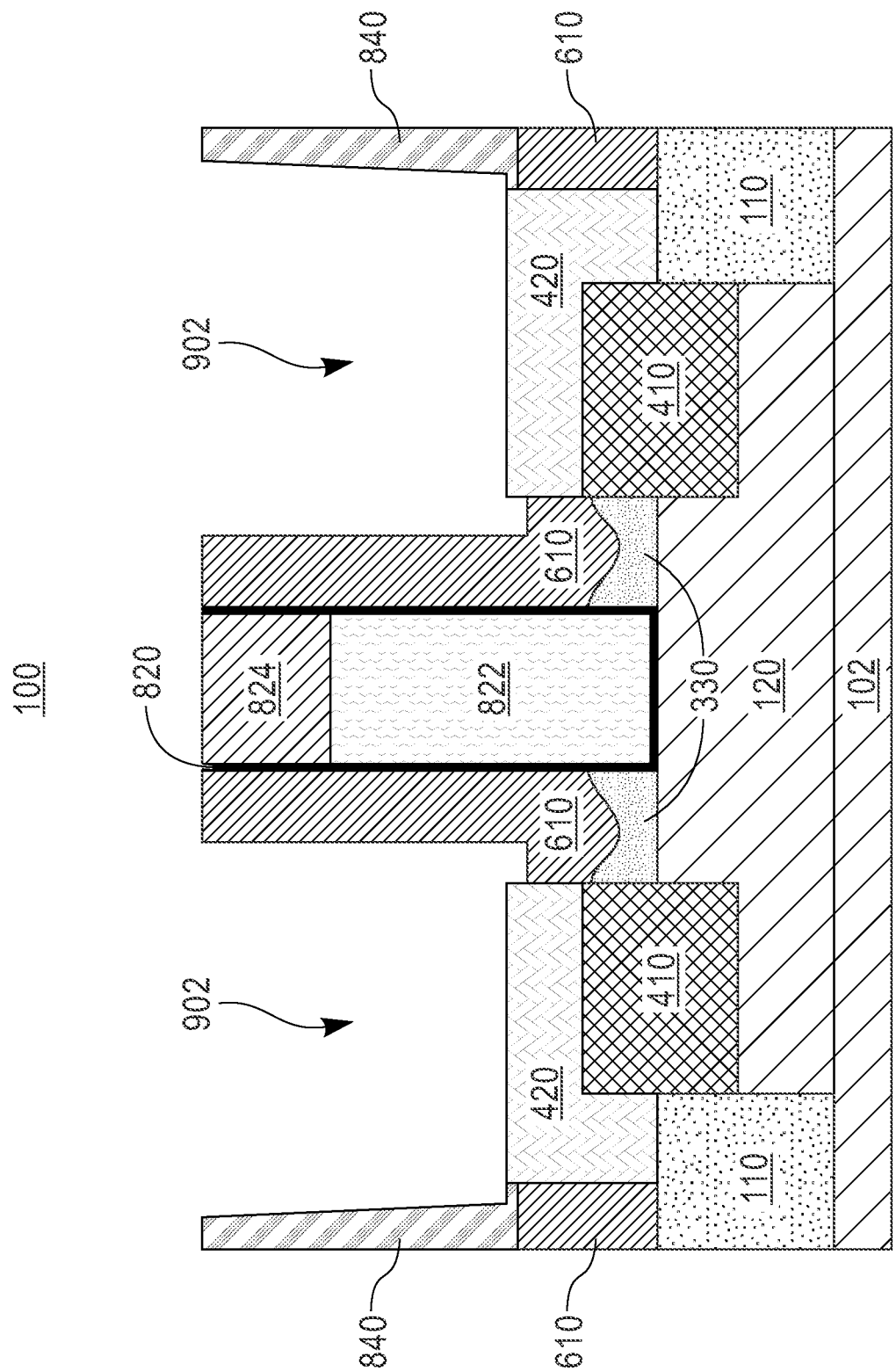
FIG. 9 is a cross-sectional view of a semiconductor structure after patterning the first dielectric layer and forming contact trenches, according to an embodiment of the present disclosure.

Referring now to FIG. 9, a cross-sectional view of the semiconductor structure 100 is shown after patterning the first dielectric layer 840 to form contact trenches 902, according to an embodiment of the present disclosure.

As known by those skilled in the art, patterning of the first dielectric layer 840 to form the contact trenches 902 involves exposing a pattern (not shown) on a photoresist layer (not shown) and transferring the exposed pattern to the first dielectric layer 840. After transferring the pattern and forming the contact trenches 902, the photoresist layer can be removed using any photoresist striping method known in the art including, for example, plasma ashing.

As shown in the figure, the contact trenches 902 expose a top surface of the sacrificial cap 420 and a top surface and sidewalls of the sacrificial spacer 610.

Figure 10:
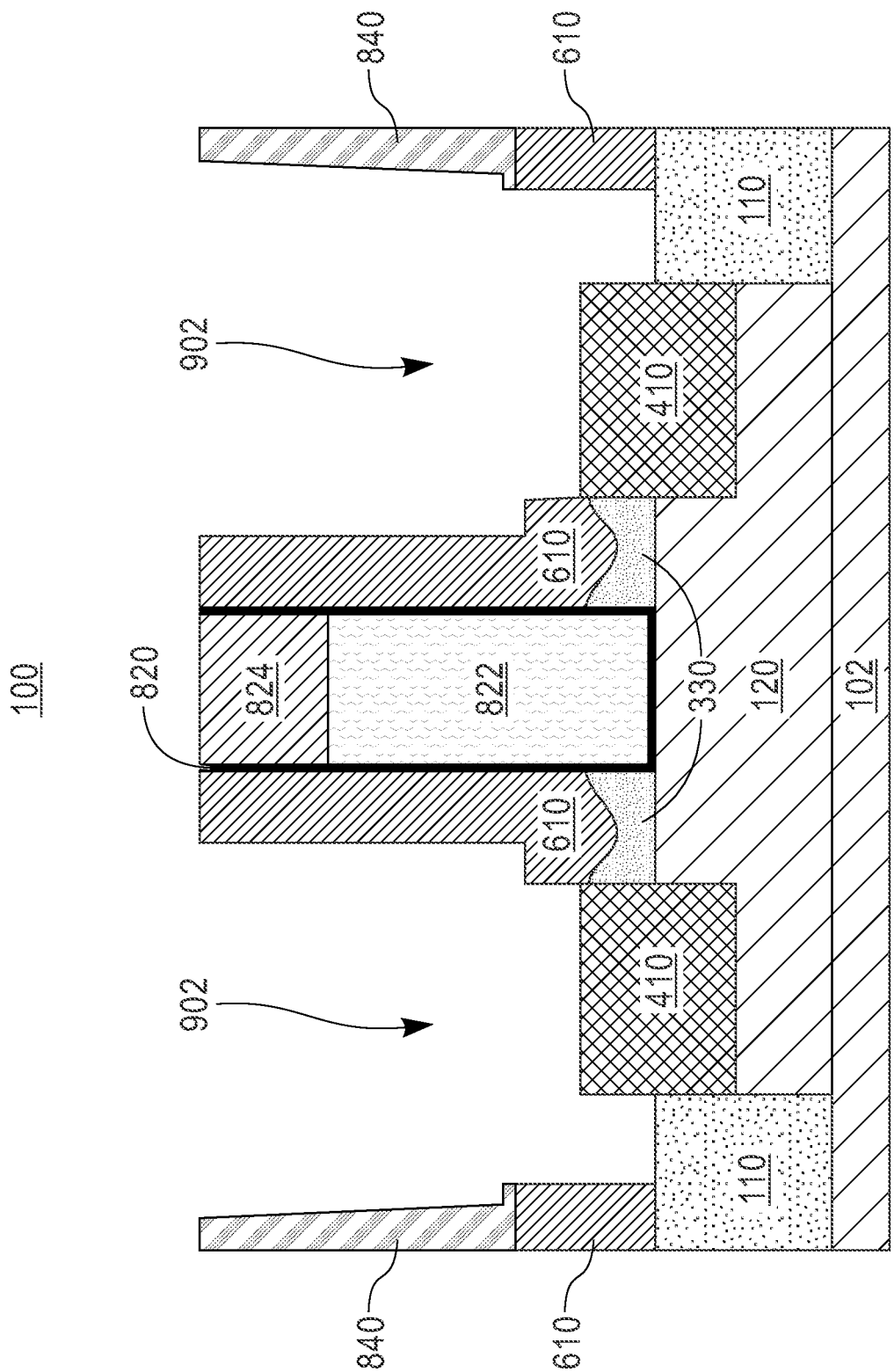
FIG. 10 is a cross-sectional view of the semiconductor structure after selectively removing the sacrificial cap, according to an embodiment of the present disclosure.

Referring now to FIG. 10, a cross-sectional view of the semiconductor structure 100 is shown after selectively removing the sacrificial cap 420, according to an embodiment of the present disclosure.

Exemplary techniques suitable for removing the sacrificial cap 410 (FIG. 9) from the semiconductor structure 100 may include, but are not limited to, gas phase etch containing hydrogen fluoride (HCl), wet etching containing a mix of ammonia and hydrogen peroxide, which causes minimal or no damage to the underlying layers or structures. As depicted in the figure, removal of the sacrificial cap 410 (FIG. 9) expands the contact trenches 902 exposing now the source/drain regions 410, including a top surface as well as sidewalls of source/drain region 410, and further exposing the sacrificial spacers 610. Exposing the sidewalls of the source/drain regions 410 allows subsequently formed metal contacts to wrap around the source/drain regions 410 thereby increasing a contact area and reducing the contact resistance.

Figure 11:
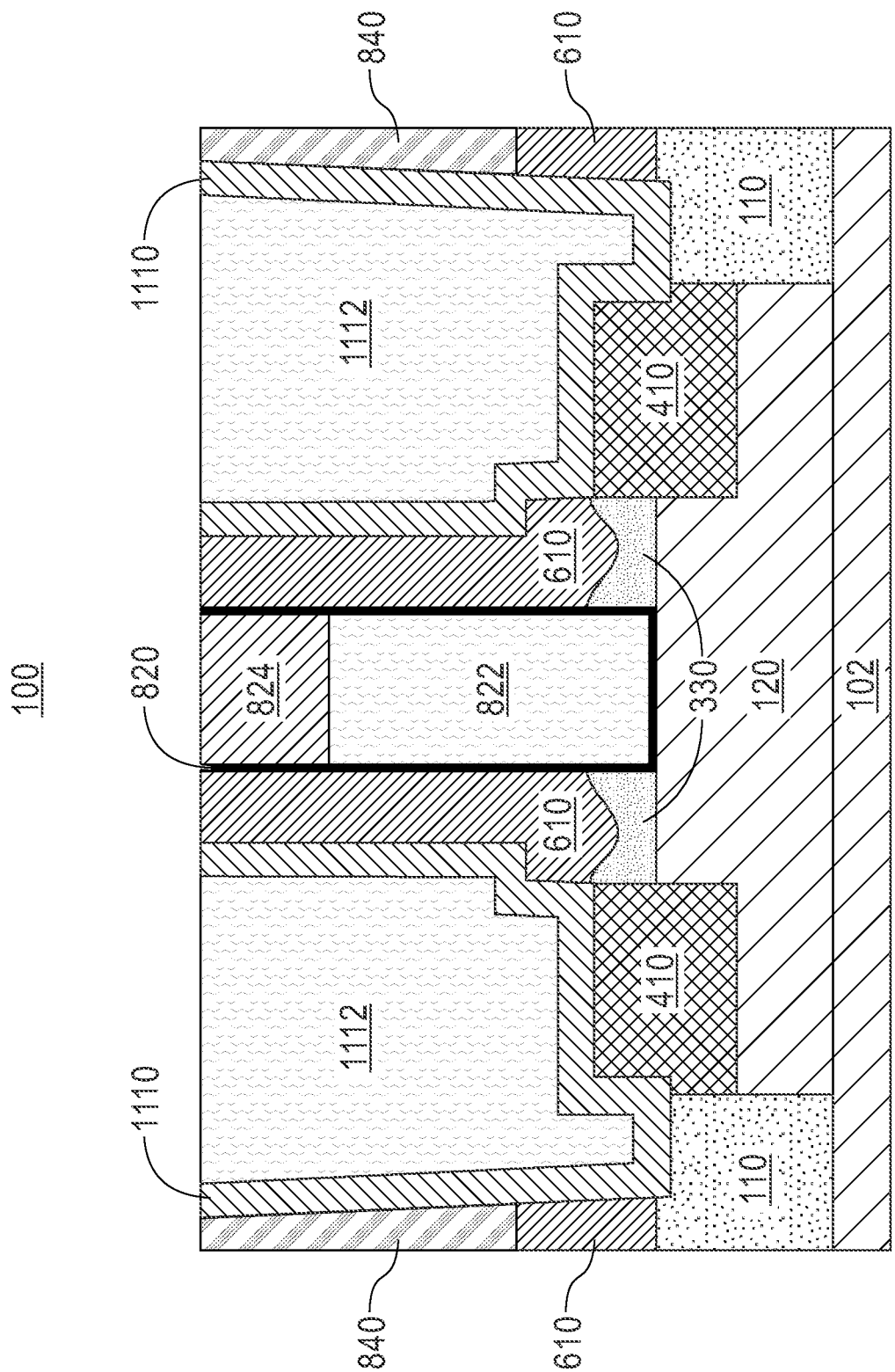
FIG. 11 is a cross-sectional view of the semiconductor structure after forming contact structures within the contact trenches, according to an embodiment of the present disclosure.

Referring now to FIG. 11, a cross-sectional view of the semiconductor structure 100 is shown after forming contact structures within the contact trenches 902 (FIG. 10), according to an embodiment of the present disclosure.

The process of forming contacts includes forming the contact trenches 902 (FIG. 10) within the first dielectric layer 840 and subsequently filling the contact trenches with a conductive material or a combination of conductive materials to form the contact structures. In this embodiment, a contact liner 1110 and a contact metal 1112 are deposited within the contact trenches 902 to form the contact structures. Formation of the contact liner 1110 within the contact trenches 902 includes depositing a layer of a first conductive material including, for example, titanium (Ti) or titanium nitride (TiN) using standard deposition methods. According to an embodiment, a thickness of the contact liner 1110 may be approximately 3 nm. The contact metal 1112 is subsequently deposited directly above the contact liner 1110 to fill the contact trenches 902 (FIG. 10) using standard deposition method such as, for example, CVD, PECVD, PVD, plating, thermal or e-beam evaporation, or sputtering. The contact metal 1112 is made of a second conductive material including, for example, cobalt (Co), tungsten (W), aluminum (Al), platinum (Pt), gold (Au), titanium (Ti), or any combination thereof. In one or more embodiments, a planarization process, for example, CMP, is performed to remove any conductive material from upper surfaces of the semiconductor structure 100.

Figure 12:
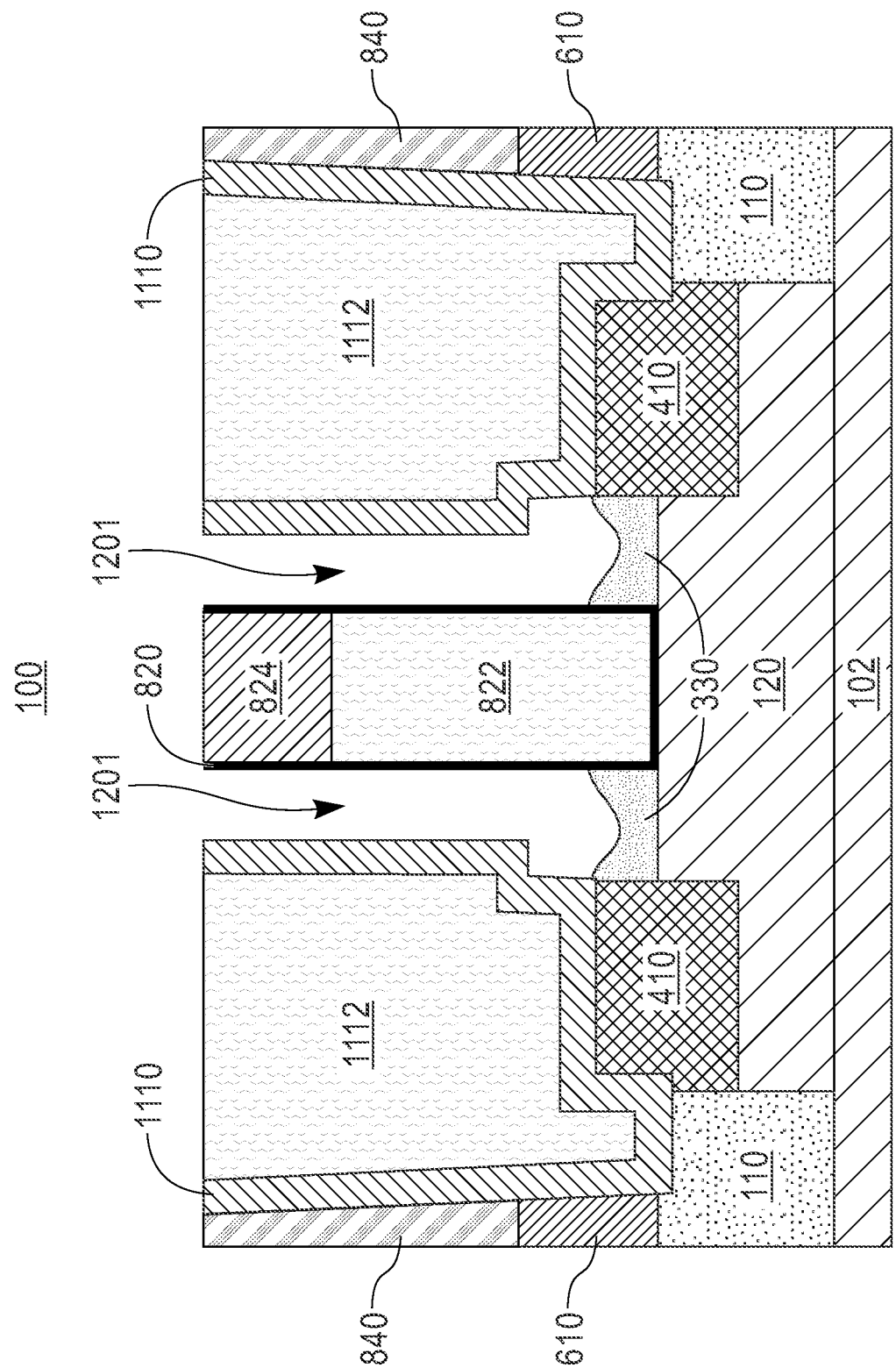
FIG. 12 is a cross-sectional view of the semiconductor structure after removing the sacrificial spacer, according to an embodiment of the present disclosure.

Referring now to FIG. 12, a cross-sectional view of the semiconductor structure 100 is shown after removing the sacrificial spacer 610, according to an embodiment of the present disclosure.

Any suitable etching techniques can be used to selectively remove the sacrificial spacer 610 from the semiconductor structure 100. Preferably, an etch chemistry that does not damage the remaining portions of the first spacer 330 and the contact liner 1110 is used to selectively remove the sacrificial spacer 610. For example, a plasma etch containing CHF3, CF4, hydrogen, and/or hydrogen, can be used to remove the sacrificial spacer 610 from the semiconductor structure 100. It should be noted that, in this embodiment, the removal chemistry used to remove the sacrificial spacer 610 does not affect or damage the gate dielectric 820 due to the presence of the first spacer 330. Stated differently, the remaining portions of the first spacer 330 protect the gate dielectric 820 during removal of the sacrificial spacer 610.

As depicted in the figure, removal of the sacrificial spacer 610 creates airgaps 1201 in the semiconductor structure 100 and exposes a top surface of the first spacer 330 and inner sidewalls of the contact liner 1110. According to an embodiment, a size of the airgaps 1201 is defined by a width or horizontal thickness of the contact liner 1110 and a width or horizontal thickness of the gate dielectric 820. Thus, the size of the airgaps 1201 can be adjusted or controlled according to design requirements by tuning the dimensions of the contact liner 1110 and/or gate dielectric 820.

Figure 13:
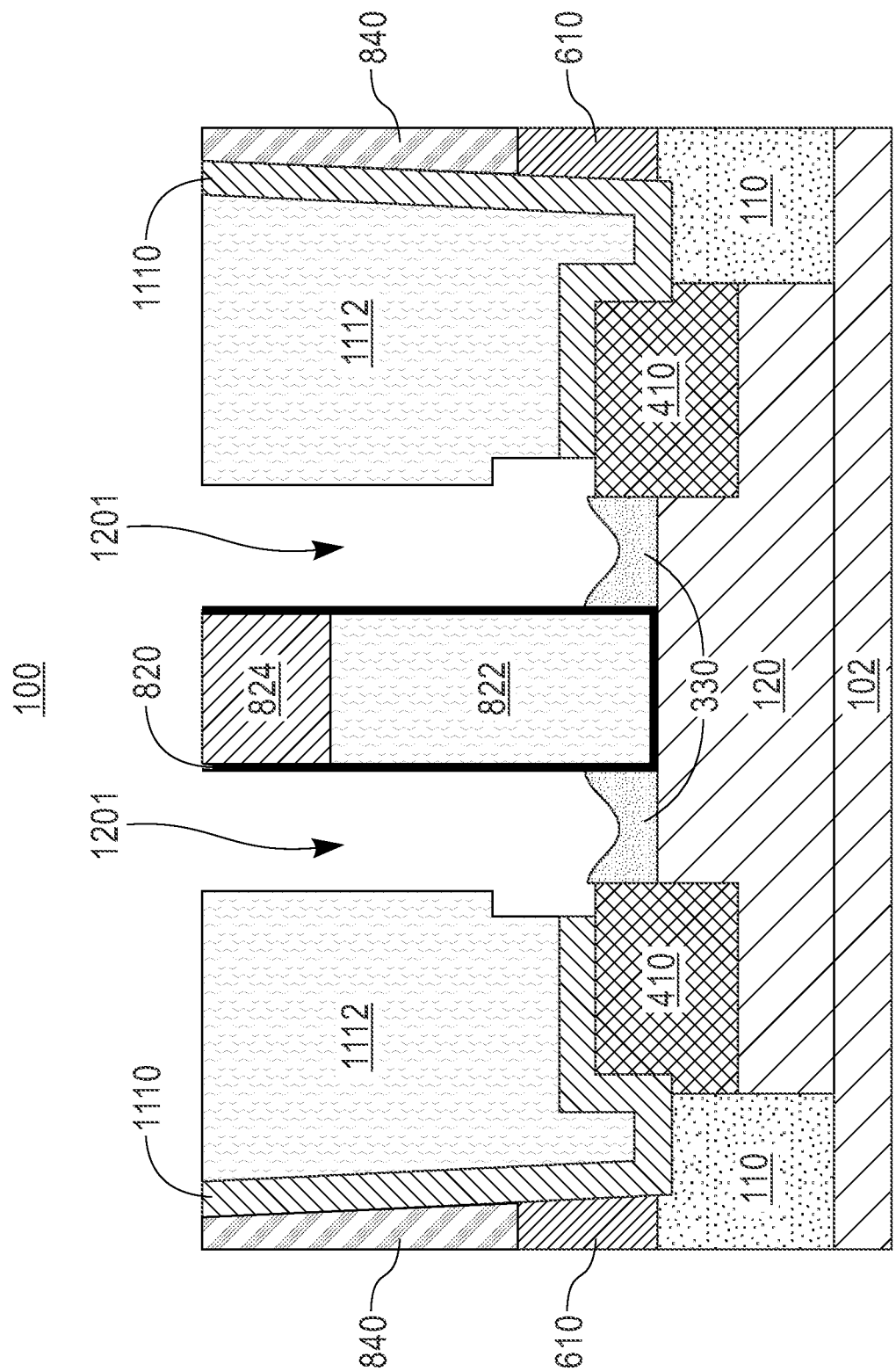
FIG. 13 is a cross-sectional view of the semiconductor structure after removing exposed portions of the contact liner, according to an embodiment of the present disclosure.

Referring now to FIG. 13, a cross-sectional view of the semiconductor structure 100 is shown after removing exposed portions of the contact liner 1110, according to an embodiment of the present disclosure.

In an exemplary embodiment, an aqueous etch solution containing a mix of hydrogen peroxide and ammonia can be used to remove the portions of the contact liner 1110 exposed after removing the sacrificial spacer 601 (FIG. 11). As can be observed in the figure, removing the exposed portions of the contact liner 1110 located on inner sidewalls of the contact metal 1112, widens the airgaps 1201. Stated differently, exposed portions of the contact liner 1110 are removed from the semiconductor structure 100 to increase a size of the airgaps 1201. As shown in the figure, the contact liner 1110 remains between the source/drain regions 410 and the contact metal 1112, but it is removed from areas located between the contact metal 1112 and the gate electrode 822. As may be understood, the wider the airgaps 1201, the lower the parasitic capacitance. Also, removal of the exposed portions of the contact liner 1110 may provide additional space for essential device elements such as gate, source/drain contacts, and spacers.

It should be noted that the contact liner 1110 has a higher resistance than the contact metal 1112. Thus, removing the exposed portions of the contact liner 1110 does not increase contact resistance in the semiconductor structure 100. Alternatively or additionally, inner sidewalls of the gate dielectric 820 can be selectively etched (e.g., using dry etch techniques) to reduce its thickness and further increase a size of the airgaps 1201.

Figure 14:
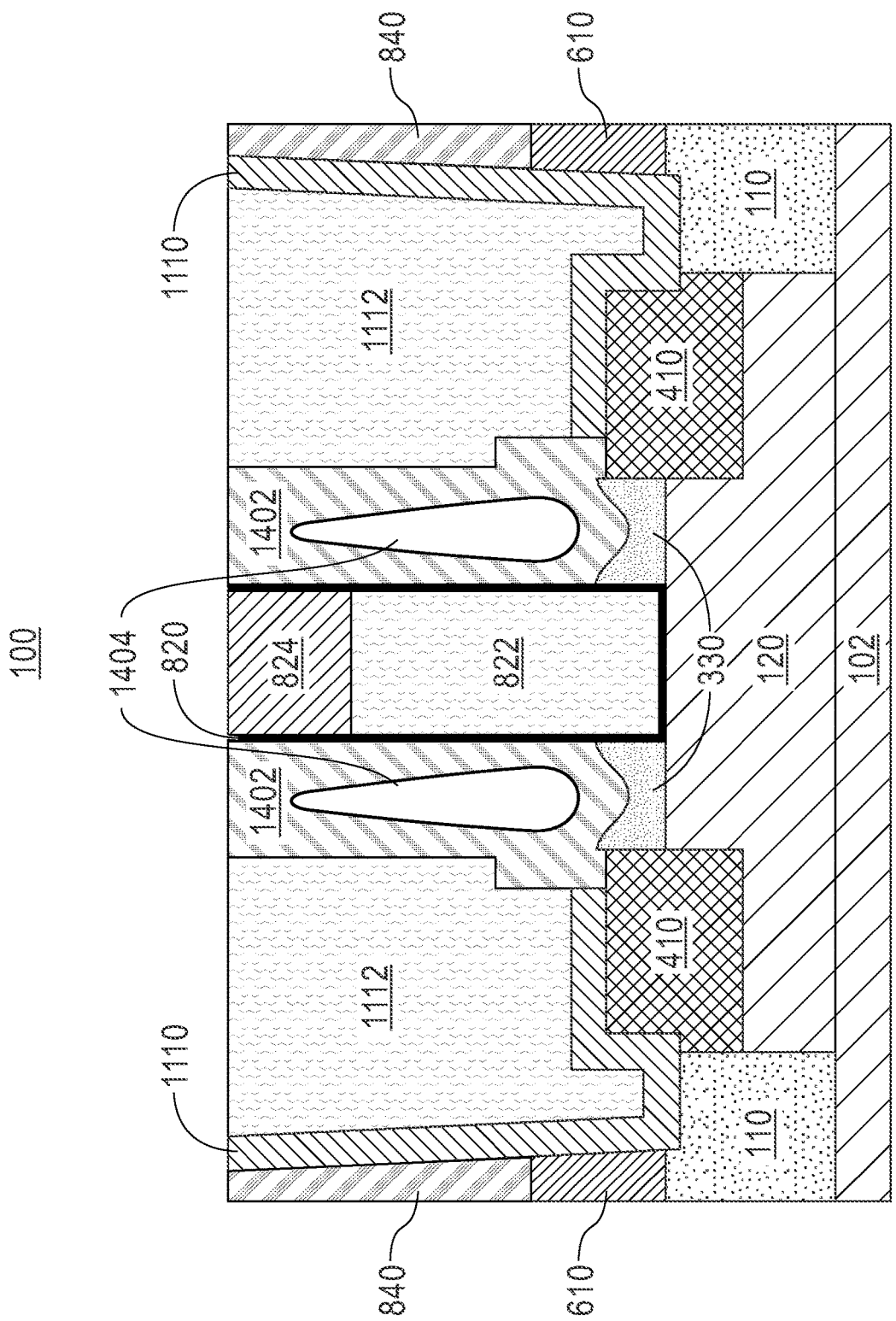
FIG. 14 is a cross-sectional view of the semiconductor structure after depositing a second dielectric layer and forming airgap spacers, according to an embodiment of the present disclosure.

Referring now to FIG. 14, a cross-sectional view of the semiconductor structure 100 is shown after depositing a second dielectric layer 1402 and forming airgap spacers 1404, according to an embodiment of the present disclosure.

The second dielectric layer 1402 can be formed by, for example, non-conformal deposition of a second dielectric material. Non-limiting examples of dielectric materials to form the second dielectric layer 1402 may include silicon oxide, silicon nitride, hydrogenated silicon carbon oxide, silicon based low-k dielectrics, flowable oxides, porous dielectrics, or organic dielectrics including porous organic dielectrics. After depositing the second dielectric layer 1402, a CMP process is conducted on the semiconductor structure 100.

As depicted in the figure, the second dielectric layer 1402 pinches-off the airgaps 1201 (FIG. 13) to form airgap spacers 1404. Specifically, airgaps 1201 (FIG. 13) formed after removing the sacrificial spacer 610 (FIG. 11) are pinched-off by the non-conformal second dielectric layer 1402 defining regions of trapped air that form the airgap spacers 1404. The airgap spacers 1404 can include air, hydrogen, or any other gas. Alternatively, the airgap spacers 1404 can have a gas pressure lower than ambient pressure or near vacuum, depending on the pressure during the deposition of the second dielectric layer 1402. In one embodiment, the second dielectric layer 1402 is deposited by plasma enhance chemical vapor deposition (PECVD). Alternatively, the second dielectric layer 1402 can be deposited by low-pressure chemical vapor deposition (LPCVD). Since air has a dielectric constant of approximately 1, the airgap spacers 1404 can reduce parasitic capacitance in the semiconductor structure 100.

As can be observed in the figure, the airgaps spacers 1404 include a unique shape that is consequence of the non-conformal deposition process used to form the second dielectric layer 1402. The shape of the airgap spacers 1404 is narrower at a top portion of the airgap spacers 1404 and wider at the lower portion of the airgap spacers 1404 close to the source/drain region 410. The wider lower portion of the airgap spacers 1404 allows a larger airgap between the gate structure and the source/drain regions 410 that further reduces the fringing capacitance between the metal gate structure and the source/drain regions 410.

Accordingly, the proposed embodiments provide a spacer structure located between the source/drain regions 410, the contact metal 1112, and the metal gate stack. The spacer structure including a bottom spacer formed by the first spacer 330 and a top spacer or second spacer formed by the second dielectric layer 1402. The second spacer formed by the second dielectric layer 1402 includes the airgap spacers (or simply airgaps) 1404.

Thus, embodiments of the present disclosure allow forming the airgap spacers 1404 simultaneously with wrap-around contact structures thereby reducing parasitic capacitance and parasitic resistance at the same time. Additionally, the proposed embodiments enable further reducing transistor size by removing portions of the contact liner 1110, thereby providing additional space for essential device elements such as gate, source/drain contacts, and spacers.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a gate structure located adjacent to a source/drain region;
    a spacer structure located between the gate structure and the source/drain region, the spacer structure including a top spacer and a bottom spacer, the top spacer including an airgap having a bottom portion that is wider than a top portion, wherein the wider bottom portion of the airgap is located between the gate structure and the source/drain region; and
    a contact structure above the source/drain region, the contact structure including a contact liner above the source/drain region and a contact metal above the contact liner, wherein the top spacer comprises a non-conformal dielectric material that pinches-off a space located above the bottom spacer between the contact structure and the gate structure for forming the airgap.

2. The semiconductor structure of claim 1, wherein the bottom spacer comprises a low-k dielectric material.

3. A semiconductor structure, comprising:
    a metal gate stack in contact with a first portion of a channel layer on a substrate, the first portion of the channel layer being located between source/drain regions;
    a first spacer located above a second portion of the channel layer extending outwards from the metal gate stack, the first spacer being disposed between a bottom portion of the metal gate stack and portions of the source/drain regions located above the substrate; and
    a contact structure above the source/drain regions, the contact structure being in contact with a second spacer disposed above the first spacer and between the contact structure and the metal gate stack, the second spacer including an airgap having a bottom portion that is wider than a top portion, wherein the wider bottom portion of the airgap is located between the metal gate stack and each of the source/drain regions, wherein the second spacer comprises a non-conformal dielectric material for pinching-off a space located above the first spacer and between the contact structure and the metal gate stack for forming the airgap.

4. The semiconductor structure of claim 3, wherein the contact structure further comprises:
    a contact liner; and
    a contact metal above the contact liner, a first portion of the contact liner being above the source/drain regions, a second portion of the contact liner being disposed on an outer sidewall of the contact metal, wherein, the contact liner is not formed on inner sidewalls of the contact metal adjacent to the metal gate stack.

5. The semiconductor structure of claim 4, wherein the inner sidewalls of the contact metal are in direct contact with the second spacer for increasing a size of the airgap.

6. The semiconductor structure of claim 3, wherein the metal gate stack further comprises:
    a gate dielectric;
    a gate electrode above the gate dielectric; and
    a gate cap above the gate electrode.

7. The semiconductor structure of claim 6, wherein a thickness of the gate dielectric is reduced to further increase the size of the airgap.

8. The semiconductor structure of claim 3, wherein the first spacer comprises a low-k dielectric material including SiOC.

9. The semiconductor structure of claim 3, wherein a top surface of the first spacer is below a top surface of the source/drain regions.

10. A method of forming a semiconductor structure, comprising:
    forming a metal gate stack in contact with a first portion of a channel layer on a substrate, the first portion of the channel layer being located between source/drain regions;
    forming a first spacer above a second portion of the channel layer extending outwards from the metal gate stack, the first spacer being formed between a bottom portion of the metal gate stack and portions of the source/drain regions located above the substrate;
    forming a contact structure above the source/drain regions; and
    forming a second spacer above the first spacer and between the contact structure and the metal gate stack, the second spacer including an airgap having a bottom portion that is wider than a top portion, wherein the wider bottom portion of the airgap is located between the metal gate stack and each of the source/drain regions, wherein the second spacer comprises a non-conformal dielectric material for pinching-off a space located above the first spacer and between the contact structure and the metal gate stack for forming the airgap.

11. The method of claim 10, wherein forming the contact structure further comprises:
    forming a contact liner;
    forming a contact metal above the contact liner, a first portion of the contact liner being above the source/drain regions, a second portion of the contact liner being disposed on an outer sidewall of the contact metal; and
    etching a third portion of the contact liner from inner sidewalls of the contact metal adjacent to the metal gate stack.

12. The method of claim 11, wherein the inner sidewalls of the contact metal are in direct contact with the second spacer for increasing a size of the airgap.

13. The method of claim 10, wherein forming the metal gate stack further comprises:
    forming a gate dielectric;
    forming a gate electrode above the gate dielectric; and
    forming a gate cap above the gate electrode.

14. The method of claim 13, further comprising:
    reducing a thickness of the gate dielectric to further increase the size of the airgap.

15. The method of claim 10, wherein the first spacer comprises a low-k dielectric material including silicon oxycarbide.

16. The method of claim 10, further comprising:
    forming a sacrificial gate stack above the first portion of channel layer, the second portion of the channel layer extending outwards from the sacrificial gate stack, the channel layer being located between shallow trench isolation regions;
    depositing a first spacer material above the second portion of the channel layer, the sacrificial gate stack and the shallow trench isolation regions;
    etching the first spacer material to form the first spacer;
    epitaxially growing the source/drain regions off the second portion of the channel layer;
    epitaxially growing a sacrificial cap off the source/drain regions, a first portion of the sacrificial cap being adjacent to the first spacer and a second portion of the sacrificial cap being above the shallow trench isolation regions;
    recessing the first spacer, a portion of the first spacer remains on a bottom region of the sacrificial gate stack;
    depositing a sacrificial spacer above the sacrificial gate stack, the first spacer, the sacrificial cap and the shallow trench isolation regions, wherein a thickness of the sacrificial spacer is less than a thickness of the first spacer;
    recessing the sacrificial spacer to expose top portions of the sacrificial cap and top portions of the sacrificial gate stack;
    depositing a first dielectric layer above the sacrificial spacer and the exposed top portions dielectric cap; and
    replacing the sacrificial gate stack with the metal gate stack.

17. The method of claim 16, further comprising:
    etching the first dielectric layer to form contact trenches, the contact trenches expose the top portions of the sacrificial cap; and
    removing the sacrificial cap, wherein removing the sacrificial cap exposes the source/drain regions and a first portion of the shallow trench isolation regions.

* * * * *